United States Patent
Andersson

(10) Patent No.: US 6,621,335 B2
(45) Date of Patent: Sep. 16, 2003

(54) CLASS D AMPLIFIER WITH PASSIVE RC NETWORK

(75) Inventor: Bengt-Olov Andersson, Carlsbad, CA (US)

(73) Assignee: Microsemi Corporation, Irvine, CA (US)

( * ) Notice: Subject to any disclaimer, the term of this patent is extended or adjusted under 35 U.S.C. 154(b) by 1 day.

(21) Appl. No.: 10/080,932

(22) Filed: Feb. 22, 2002

(65) Prior Publication Data

US 2002/0153947 A1 Oct. 24, 2002

Related U.S. Application Data

(60) Provisional application No. 60/284,444, filed on Apr. 18, 2001.

(51) Int. Cl.[7] ............................. H03F 3/38; H03F 3/217
(52) U.S. Cl. ..................... 330/10; 330/207 A; 330/251; 330/291; 330/118
(58) Field of Search .................. 330/10, 207 A, 330/251, 291, 118

(56) References Cited

U.S. PATENT DOCUMENTS

| | | |
|---|---|---|
| 4,079,373 A | 3/1978 | Brown |
| 4,968,948 A | 11/1990 | Tokuma |
| 4,978,959 A | 12/1990 | Chong et al. |
| 5,010,337 A | 4/1991 | Hisano et al. |
| 5,369,402 A | 11/1994 | Kwon |
| 5,608,401 A | 3/1997 | Viswanathan et al. |
| 5,614,903 A | 3/1997 | Oyama |
| 5,815,581 A | 9/1998 | Andersson |
| 5,838,193 A * | 11/1998 | Myers et al. .................. 330/10 |
| 6,016,075 A * | 1/2000 | Hamo ......................... 330/10 |
| 6,249,182 B1 | 6/2001 | Pullen |
| 6,320,460 B1 | 11/2001 | Meszlenyi |
| 6,346,852 B1 | 2/2002 | Masini et al. |
| 6,441,760 B2 | 8/2002 | Albinet et al. |
| 2002/0153947 A1 * | 10/2002 | Andersson .................... 330/10 |

FOREIGN PATENT DOCUMENTS

| | | | |
|---|---|---|---|
| EP | 483094 | * | 4/1992 |
| JP | 5152867 | * | 6/1993 |

OTHER PUBLICATIONS

Tan et al. "Novel self–error–correction pulse width modulator for a class D hearing instrument amplifier" IEEE Proceedings on Circuits, Devices and Systems, vol. 148 Issue 5, Oct. 2001 pp. 261–266.*

* cited by examiner

Primary Examiner—Michael B Shingleton
(74) Attorney, Agent, or Firm—Jackson Walker LLP.; Michael Cameron, Esq.; Robert Klinger, Esq.

(57) ABSTRACT

A Class D amplifier device with reduced power consumption uses a passive RC network. The output of the RC network directly feeds a comparator resulting in increased efficiency. The RC network is configured to perform several functions, including the low pass filtering of the feedback signal to remove high frequency/high amplitude clock components and provides a DC path from its output to reduce duty cycle errors. Additionally, the input signal receives low pass filtering, creating a generally flat frequency response. Finally, the clock signal is filtered to generate a triangle wave of good linearity and appropriate amplitude.

36 Claims, 3 Drawing Sheets

CLASS D AMPLIFIER WITH PASSIVE RC NETWORK

CROSS REFERENCE TO RELATED APPLICATIONS

This application claims priority of U.S. Provisional Patent Application No. 60/284,444 filed on Apr. 18, 2001 entitled "Class D Amplifier with Passive RC Network," and the teachings are incorporated herein by reference.

TECHNICAL FIELD OF THE INVENTION

The present invention relates to an efficient audio signal amplifier and, more specifically, to a Class D amplifier using a passive resistive-capacitive (RC) network. More specifically, the present invention relates to Class D amplifier device utilizing a passive RC network that reduces current consumption and increases efficiency. The use of selectable output stages also reduces current consumption.

BACKGROUND OF THE INVENTION

Class D amplifiers are in widespread use for a variety of applications. In audio applications, for example, the Class D amplifier has become an attractive alternative for applications that require high efficiency and low distortion. U.S. Pat. No. 4,689,819 to Killion describes the use of a Class D amplifier in a hearing aid application. In hearing aid applications, a premium is placed on the ability of the device to operate as close as possible to distortion free while maintaining suitable levels of amplifier performance.

A problem associated with prior art Class D amplifier devices is the use of active feedback loops that utilize substantial amounts of power. FIG. 1 illustrates a prior art class D amplifier circuit, denoted as 10, wherein a traditional feedback loop is established between the output and the input using an error amplifier. Essentially, circuit 10 uses an output stage 12 with an H-bridge output stage delivering output 14 that, in turn, drives load 16. The output signal 14 is coupled to the feedback loop 16 comprising of feedback impedance 18 which forms an input to error amplifier 20. The use of error amplifier 20 in a class D amplifier circuit, such as circuit 10, is well known in the industry. The output of the error amplifier 20 is fed to a comparator circuit 22 which, in turn, is driven by the 391 wave generator 24 which provides a clock signal for operating the output stage 12, and specifically for controlling the duty cycle of the output stage 12. Thus, the input signal 26 and feedback signal 16 are summed and provided to the error amplifier 20 which controls the stability of the circuit 10 and amplitude of the output signal 14 as a function of the feedback impedance 18 over the input impedance 28.

In a Class D amplifier circuit, such as circuit 10, the input and feedback signals are normally summed in an amplifier, such as error amplifier 20. This increases power consumption since the amplifier 20 is an active device requiring current to operate. Moreover, since the output stage 12 is always operating, power consumption at the output can be significant even for small signals outside the audible range. Accordingly, a Class D amplifier device with reduced internal power consumption would provide numerous advantages.

SUMMARY OF THE INVENTION

The present invention provides a Class D amplifier device with reduced power consumption. Essentially, power consumption is minimized by the use of a passive RC network. The output of the RC network directly feeds a comparator resulting in increased efficiency for low power audio applications. The RC network is configured to perform several functions, including the low pass filtering of the feedback signal to remove high frequency/high amplitude clock signals. In addition, the RC network provides a DC path from its output to reduce duty cycle errors. Additionally, the input signal receives low pass filtering, creating a generally flat frequency response. Finally, the clock signal is filtered to generate a triangle wave of good linearity and appropriate amplitude.

According to another embodiment, the present invention provides a Class D amplifier device with selectable output stages having gate drives that activate, depending on the load impendance and signal level, and therefore optimize current consumption and efficiency. By separating the gate drives into upper and lower stages, only those that are enabled corresponding to a suitable signal level amplitude are active, limiting consumption by other gate drive circuits in the output stage.

A technical advantage of the present invention is reduced current consumption by the driving stage in a Class D amplifier circuit.

Another technical advantages of the present invention is increased efficiency by the use of a passive RC network to generate the appropriate drive signals to the output.

BRIEF DESCRIPTION OF THE DRAWINGS

For a better understanding of the invention including its features, advantages and specific embodiments, reference is made to the following detailed description along with accompanying drawings in which.

Corresponding references in the detailed description correspond to like parts in the figures unless otherwise indicated.

DETAILED DESCRIPTION OF THE PREFERRED EMBODIMENTS

While the making and using of various embodiments of the present invention are discussed in detail below, it should be appreciated that the present invention provides many applicable inventive concepts which can be embodied in a wide variety of specific contexts.

Figure 1:
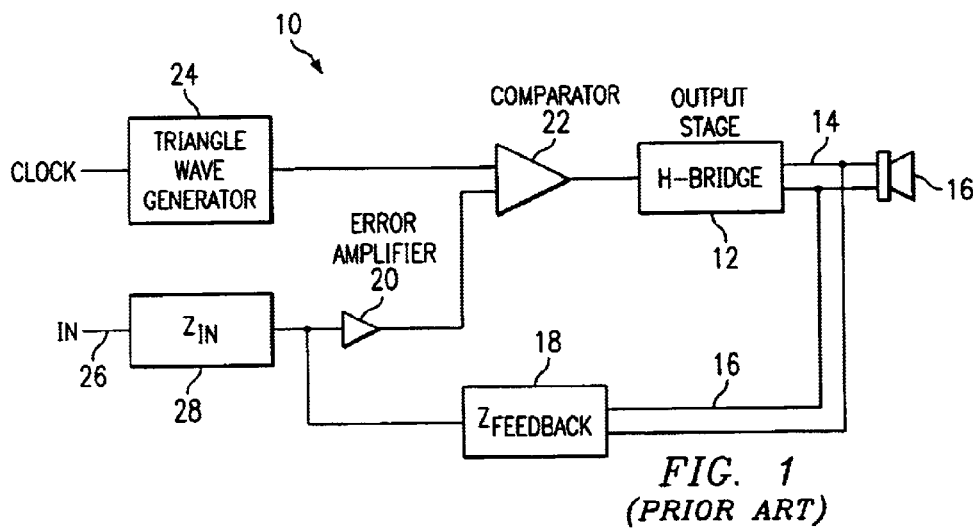
FIG. 1 is a circuit block diagram of a prior art Class D amplifier circuit.
Figure 2:
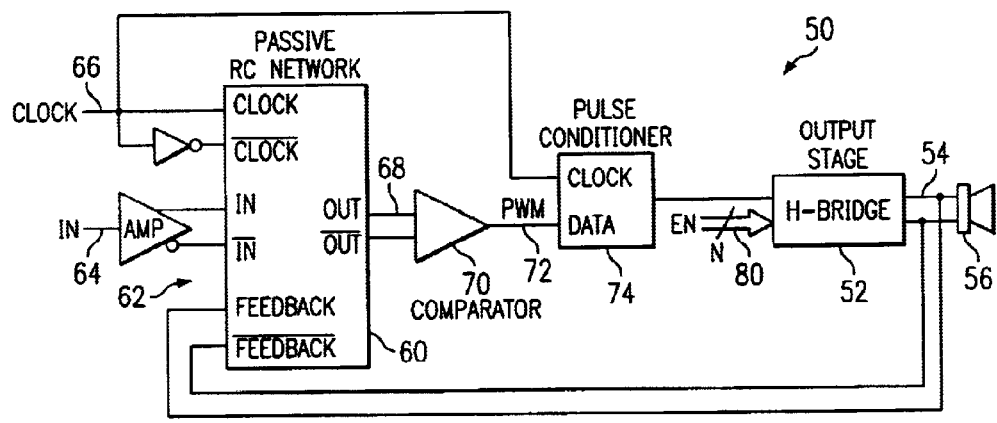
FIG. 2 is a circuit block diagram of a Class D amplifier using a passive RC network, according to the invention.

With reference now to the figures and in particular to FIG. 2, therein is shown a Class D amplifier circuit 50, according to the invention. The output stage 52 of the amplifier 50 is an H-bridge that generates output 54 to driving load 56. The load 56, for example, can comprise any suitable audio component, such as a speaker. In one application, the Class D amplifier circuit 50 is utilized in a hearing aid application wherein power consumption efficiency is a premium and the load 56 comprises a miniaturized speaker of the type found in modern hearing aids.

Figure 6:
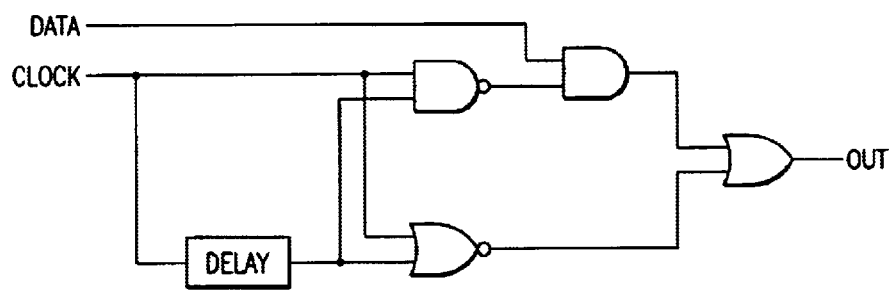
FIG. 6 shows the use of a pulse conditioner for generating suitable clock signals in a Class D amplifier.

The output 54 is fed back in a feedback loop to passive RC network 60. Essentially, the RC network 60 acts to sum the feedback signal 62, input signal 64 and clock signal 66 and provides an output 68 which drives the comparator 70. The output of the comparator 70 is a pulse width modulated waveform 72 which drives the data input of the pulse conditioner 74. FIG. 6 illustrates a suitable circuit design for the pulse conditioner 74.

The fact that the Class D amplifier circuit 50 utilizes a passive RC network 60 means that less power is consumed, resulting in higher efficiency for the application in which the circuit 50 is utilized. Also, the output stage 52 includes enable signals 80 which, as described below with reference to FIG. 4, further increases the efficiency by decreasing current consumption of the circuit 50.

Figure 3:
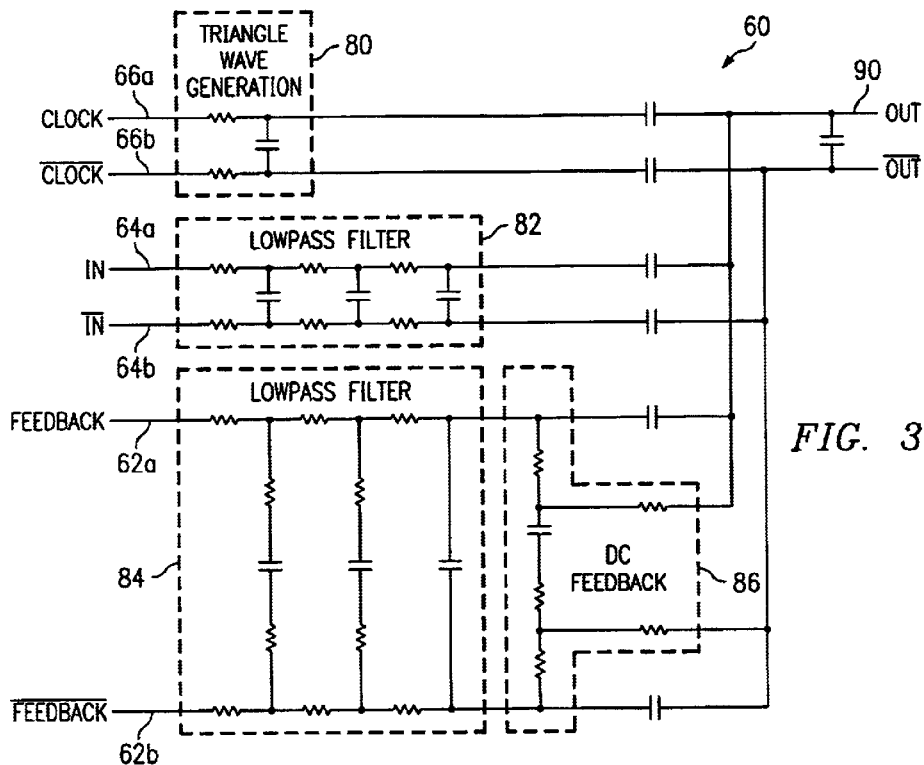
FIG. 3 is a detailed circuit diagram of the passive RC network suitable for use in a Class D amplifier, according to the invention.

With reference now to FIG. 3, therein is shown a detailed circuit schematic diagram of the passive RC network 60, according to the invention. The passive RC network 60 includes a triangle wave generator circuit 80, low pass filter 82 applied to the input signal 64A, 64B, low pass filter 84 applied to the feedback signal 62A, 62B and DC feedback circuit 86. This design provides the RC network 60 the ability to perform several functions. First, the feedback signal 62A, 62B (non-inverted and inverted, respectively) are filtered by the low pass filter 84 in order to eliminate any high frequency/high amplitude clock components and to attenuate the feedback signal 62A, 62B relative to the input signal 64A, 64B. Next, the DC feedback section 86 provides a DC path with minimal attenuation from the feedback input 62 to the output 68 of the passive RC network 60.

In addition, since low pass filtering of the feedback signal 62A, 62B also affects the high end of the audio band, the low pass filter 82 is provided for filtering of the input signal 64A, 64B in order to produce a relatively flat frequency response. Finally, the clock signal 66A, 66B is low pass filtered with filter 80 in order to generate a triangle wave having good linear characteristics and the appropriate amplitude.

Figure 4:
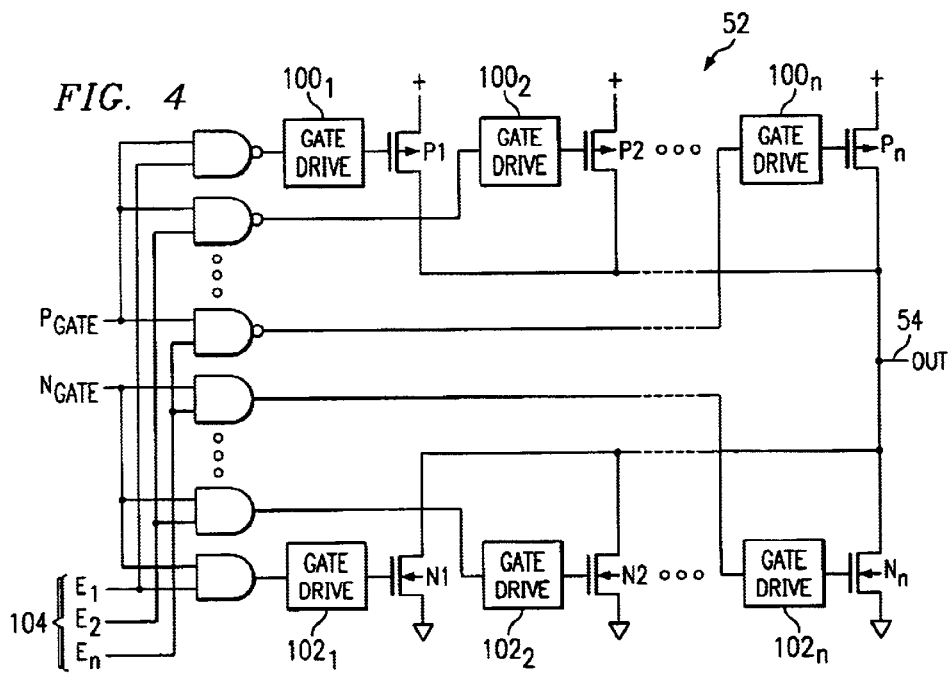
FIG. 4 illustrates the selectable output stages and gate drive circuit according to the invention.

Therefore, the passive RC network 60 is capable of performing the functions of an active amplifier without the excessive current consumption required by an active amplifier. The reason to choose a Class D amplifier instead of a more traditional Class A or Class AB is a possibility of achieving higher efficiency. In this regard, a relatively large part of the total internal current consumption is used by the output stage, such as output stage 12, especially if the transistors in the H-bridge are driven from a double voltage to reach a low resistance at low supply voltages. As seen in FIG. 4, the output stage 52 provides the ability of disabling a portion of the outputs by placing them in high impedance state. If, for instance, the output stage 52 is divided into two parallel stages with ⅓ and ⅔ of the total driving capability in separate enable signals, three different levels of power consumption and driving capability are available.

The output stage 52 includes N number of P gate drives and N number of N gate drives, $100_{1N}$, $102_{1N}$, respectively. Enable signals 104 are provided to allow for selectably engaging the desired stage. The level of the input signal or output signal are used to control the output stage (taking into account the load impedance). The selection may be static based on low impedance or dynamic, depending on a combination of load impedance and output level. At low output levels, the saved internal current consumption with low driving capability can offset the reduced efficiency due to higher voltage drops over the transistors.

Besides the internal current consumption, the on resistance in the output switches is critical for efficiency and should ideally be zero. This, of course, is not possible, but the resistance should at least be small compared to the load resistance. Even this requirement can be difficult to meet in applications where the supply voltage can drop to voltages not much higher than the threshold voltage of the switch transistors in the output stage. Either very large output transistors driven by the supply voltage are used, or smaller transistors driven by voltages larger than the supply voltage. In the latter case, the NMOS thresholds are low enough so the low-side switches can be driven directly from the supply voltage while the PMOS transistors used as high-side switches is driven by a doubled supply voltage because of their higher threshold voltages.

Figure 5:
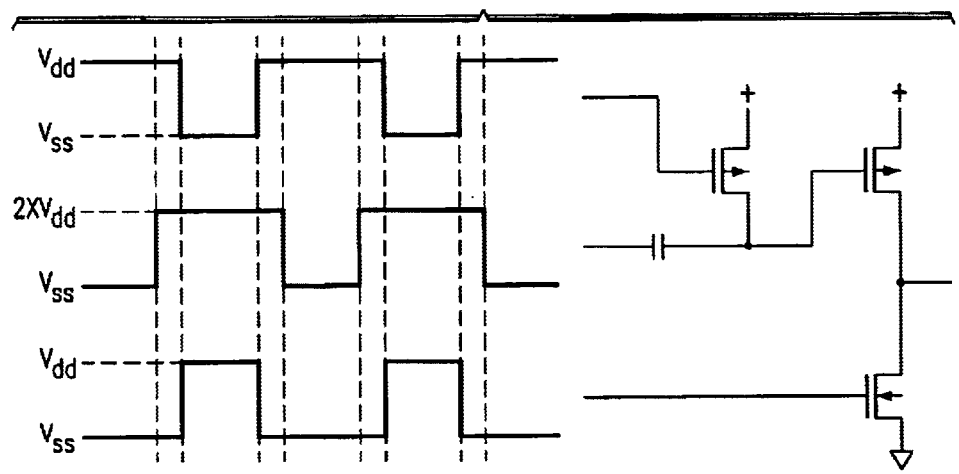
FIG. 5 shows one of N parallel stages and a timing diagram illustrating the operation of the stage, according to the invention.

When driving PMOS transistors manufactured in an N-well process with doubled supply voltage, the gate voltage will be driven below the substrate voltage so no NMOS transistors can be connected directly to the gate. Instead, as shown in FIGS. 5a and 5b, the gate is capacitively driven from a clock swinging between VSS and 2*VDD. To define the DC level after the capacitor, the gate is held at VDD by a transistor when the clock is high and is left floating while the clock is low and the PMOS transistor is on. Since the gate is always clocked with a high frequency, leakage currents will not change the operating point significantly.

With a dynamic circuit driving the gates in the output stage, there is a potential problem at start-up. Initially, the PMOS output transistors will not conduct until the comparator has generated enough clock cycles for the voltage doubler to get started. This will cause both of the complementary outputs to be close to the negative supply voltage. With a DC feedback from the outputs to the comparator to control duty cycle errors, the comparator will see a DC level at the negative supply as well. If the comparator common mode range can't handle this, the output will be stuck and no clocks to the output stage will be generated so the circuit can start. A comparator with a PMOS input stage may eliminate this problem, but in many cases, the PMOS thresholds are higher than NMOS thresholds, so for low voltage operation, NMOS transistors are often the best choice. With the function of the pulse width modulator in mind, it is safe to say that at the peak of the triangle wave, the output should always have one known state, and the opposite state at the bottom of the triangle wave unless the circuit is clipping. Therefore, the additional circuit of FIG. 6 can be used to override the comparator output at these moments and force the signal to the output stage to pulse once per clock period. The triangle wave is generated by low pass filtering the clock, so the two peaks correspond to the two edges of the clock. An edge detector generates the two override pulses.

While the invention has been described with regard to specific and illustrative embodiments, this description is not intended to be construed in a limiting sense. Various modifications and combinations of the illustrative embodiments as well as other embodiments of the invention will become apparent to persons skilled in the art upon reference to the description and is intended that such variations be encompassed and included within the meaning and scope of the invention.

What is claimed is:

1. A Class D amplifier, comprising:
   a passive RC network being adapted to accept an inverted and non-inverted input signal, an inverted and non-inverted clock signal and an inverted and non-inverted feedback signal;
   the passive RC network being further adapted to provide a summed output of the inverted and non-inverted input signal, the inverted and non-inverted clock signal and the inverted and non-inverted feedback signal input a comparator being adapted to receive the summed output and provide a pulse width modulated signal;

a pulse conditioner being adapted to receive the pulse width modulated signal and further condition the signal; and an output stage being adapted to receive the conditioned signal and drive a load at the inverted and non-inverted output terminals of the output stage.

2. The Class D amplifier as recited in claim 1, further comprising a single-ended buffer coupled to the inverted and non-inverted signal input of the passive RC network.

3. The Class D amplifier as recited in claim 1, wherein the passive RC network further comprises:

a triangle wave generator circuit applied to the inverted and non-inverted clock signal;

a first low pass filter applied to the inverted and non-inverted input signal;

a second low pass filter applied to the inverted and non-inverted feedback signal; and a DC feedback circuit operable to provide a DC path with minimal attenuation from a feedback input to the output of the passive RC network.

4. The Class D amplifier as recited in claim 3, wherein the triangle wave generator circuit is configured as a low pass filter operable to generate a triangle wave having linear characteristics.

5. The Class D amplifier as recited in claim 3, wherein the first low pass filter accepts the inverted and non-inverted input signals and outputs the inverted and non-inverted input signals with a relatively flat frequency response.

6. The Class D amplifier as recited in claim 3, wherein the second low pass filter is operable to eliminate any high frequency and high amplitude clock signal components and to attenuate the inverted and non-inverted feedback signals relative to the inverted and non-inverted input signals.

7. The Class D amplifier as recited in claim 3 wherein the DC feedback circuit is operable to provide a DC path with minimal attenuation from a feedback input to the output of the passive RC network.

8. The Class D amplifier as recited in claim 1, wherein the passive RC network performs the function of an active amplifier circuit without excessive current consumption.

9. The Class D amplifier as recited in claim 1, wherein the comparator further comprises a differential operational amplifier.

10. The Class D amplifier as recited in claim 1, wherein a PMOS or NMOS stage is coupled to the input of the comparator operable to force the signal to the output stage to pulse once per clock period.

11. The Class D amplifier as recited in claim 1, wherein the output stage comprises output stage transistors arranged in H-bridge arrangements that generate an inverted and non-inverted output to drive a load.

12. The Class D amplifier as recited in claim 11, wherein each H-bridge includes any number of P gate drivers coupled to PMOS output stage transistors and the same number of N gate drivers coupled to NMOS output stage transistors.

13. The Class D amplifier as recited in claim 11, wherein the output stage includes a circuit operable to disable or enable complementary pairs of output stage transistors by placing them in a high impedance state.

14. The Class D amplifier as recited in claim 13, wherein enable signals are provided to allow for selectably engaging the desired number of complementary pairs of output stage transistors based on signal level, input signal and the load.

15. The Class D amplifier as recited in claim 14, wherein the enable signals may be static, based on a low impedance load or dynamic, depending on a combination of load impedance and desired output level.

16. The Class D amplifier as recited in claim 13, wherein the resistance of the output stage transistors is minimal compared to the load resistance when the output transistors are in the "on" state.

17. The Class D amplifier as recited in claim 13, wherein a subset of the output stage transistors comprise very large output transistors driven by the supply voltage.

18. The Class D amplifier as recited in claim 13, wherein a subset of the output stage transistors comprise small transistors driven by voltages larger than the supply voltage.

19. The Class D amplifier as recited in claim 18, wherein the small transistors comprise PMOS transistors used as high-side switches driven by a doubled supply voltage and NMOS transistors used as low-side switches driven directly from the supply voltage.

20. The Class D amplifier as recited in claim 19, wherein the PMOS transistors are capacitively driven from a clock swinging between VSS and 2*VDD.

21. The Class D amplifier as recited in claim 13, wherein the saved internal current consumption obtained by switching to transistors with low driving capability offsets the reduced efficiency due to higher voltage drops over the transistors.

22. The Class D amplifier as recited in claim 1, wherein the pulse conditioner further comprises:

a delay circuit, an AND gate, a NAND gate, an OR gate and a NOR gate;

a first input to the delay circuit operable to accept a clock signal;

a first input to the NAND gate operable to accept a clock signal;

a second input to the NAND gate being coupled to an output of the delay circuit;

a first input to the NOR gate being operable to accept a clock signal;

a second input to the NOR gate being coupled to the output of the delay circuit, a first input to the AND gate operable to accept a data input signal;

a second input to the AND gate being coupled to an output of the NAND gate;

a first input to the OR gate being coupled to an output of the AND gate;

a second input to the OR gate being coupled to an output of the NOR gate; and said pulse conditioner being operable to force the signal to the output stage to pulse once per clock period.

23. The Class D amplifier as recited in claim 22 wherein the load comprises an audio transducer.

24. The Class D amplifier as recited in claim 22 wherein a portion of the output signal is fed back to the passive RC network.

25. The Class D amplifier as recited in claim 22 wherein the output stage includes an enable signal which increases the efficiency of the Class D amplifier by decreasing current consumption of the circuit.

26. The Class D amplifier as recited in claim 1, adapted for use in a hearing aid device.

27. A method of amplifying signals, comprising:

inputting an inverted and non-inverted input signal, an inverted and non-inverted clock signal and an inverted and non-inverted feedback signal into a passive RC network;

summing the inverted and non-inverted input signal, inverted and non-inverted clock signal and inverted and non-inverted feedback signal in the passive RC network and outputting the combined waveform to the input of a comparator;

outputting the inverted and non-inverted conditioned pulse width modulated waveform from the comparator to the data input of a pulse conditioner;

outputting the signal of the pulse conditioner to the input of an output stage; and amplifying the signal in the output stage to drive a load at the inverted and non-inverted output terminals of the output stage.

28. The method of amplifying signals as recited in claim 27, wherein:

the inverted and non-inverted input signals are low pass filtered in the passive RC network to obtain a flat frequency response of the signal;

the inverted and non-inverted clock signal in the passive RC network are low pass filtered to generate a triangle wave having linear characteristics and an amplitude appropriate for further conditioning; and the inverted and non-inverted feedback signals are filtered by a low pass filter in the passive RC network to eliminate any high frequency and high amplitude clock components and to attenuate the inverted and non-inverted feedback signals relative to the inverted and non-inverted input signals.

29. The method of amplifying signals as recited in claim 27, wherein the passive RC network further comprises a DC feedback circuit operable to provide a DC path with minimal signal attenuation from a feedback input to the output of the passive RC network.

30. The method of amplifying signals as recited in claim 27, wherein the output stage comprises an H-bridge circuit operable to switch between any number of pairs of output stage transistors depending upon the characteristics of the signal and the load.

31. The method of amplifying signals as recited in claim 30, wherein the resistance of the output transistors is minimal compared to the load resistance when the output transistors are in the "on" state.

32. The method of amplifying signals as recited in claim 31, wherein a subset of the output stage transistors comprise very large output transistors driven by the supply voltage.

33. The method of amplifying signals as recited in claim 31, wherein a subset of the output stage transistors comprise small transistors driven by voltages larger than the supply voltage.

34. The method of amplifying signals as recited in claim 33, wherein the small transistors comprise PMOS transistors used as high-side switches driven by a doubled supply voltage and NMOS transistors used as low-side switches driven directly from the supply voltage.

35. The method of amplifying signals as recited in claim 34, wherein the gate of the PMOS transistors are capacitively driven from a clock swinging between VSS and 2*VDD.

36. The method of amplifying signals as recited in claim 27, wherein a PMOS or NMOS transistor is coupled to the input of the comparator operable to force the signal to the output stage to pulse once per clock period.

* * * * *